(12) United States Patent
Montagne

(10) Patent No.: US 9,843,331 B2
(45) Date of Patent: Dec. 12, 2017

(54) SYSTEM AND METHOD FOR OPERATING A MECHANICAL RESONATOR IN AN ELECTRONIC OSCILLATOR

(71) Applicant: FRAPINVENTIONS B.V., AA Rotterdam (NL)

(72) Inventor: Antonius Johannes Maria Montagne, KN Delft (NL)

(73) Assignee: FRAPINVENTIONS B.V., AA Rotterdam (NL)

(*) Notice: Subject to any disclaimer, the term of this patent is extended or adjusted under 35 U.S.C. 154(b) by 0 days.

(21) Appl. No.: 15/105,258

(22) PCT Filed: Dec. 10, 2014

(86) PCT No.: PCT/NL2014/050848
§ 371 (c)(1),
(2) Date: Jun. 16, 2016

(87) PCT Pub. No.: WO2015/093940
PCT Pub. Date: Jun. 25, 2015

(65) Prior Publication Data
US 2017/0005664 A1    Jan. 5, 2017

(30) Foreign Application Priority Data
Dec. 18, 2013 (NL) .................... 2011982

(51) Int. Cl.
*H03L 7/00* (2006.01)
*H03L 1/02* (2006.01)
*H03L 1/00* (2006.01)

(52) U.S. Cl.
CPC ........... *H03L 1/026* (2013.01); *H03L 1/00* (2013.01); *H03L 1/028* (2013.01)

(58) Field of Classification Search
CPC . H03L 1/025; H03L 1/026; H03L 1/00; G01L 5/0047; G01L 1/20; G01L 5/165; G01L 1/00; G01L 1/16; G01L 1/18
(Continued)

(56) References Cited

U.S. PATENT DOCUMENTS 4,949,055 A    8/1990  Leitl
5,604,468 A    2/1997  Gillig
(Continued)

FOREIGN PATENT DOCUMENTS

EP    1 898 203    3/2008

OTHER PUBLICATIONS

Benjaminson et al., "A Microcomputer-Compensated Crystal Oscillator Using a Dual-Mode Resonator", Proceedings of the 43rd Annual Symposium on Frequency Control, May 31-Jun. 2, 1989, pp. 20-26.
(Continued)

*Primary Examiner* — Arnold Kinkead
(74) *Attorney, Agent, or Firm* — Greenblum & Bernstein, P.L.C.

(57) ABSTRACT

The invention relates to a method for operating a mechanical resonator in an electronic oscillator, comprising determining a state space description of the resonator, in which state variables are the mass, the stiffness or dimensions of components used in the crystal resonator; providing a table with frequency correction factors as a function of a state space of a resonator; finding a frequency correction factor corresponding to the determined state space; and multiplying the output frequency of the resonator with the correction factor, and to an electronic oscillator, comprising a mechanical resonator, wherein an output frequency of the oscillator is multiplied by a frequency correction factor, the frequency correction factor being obtained from determination of the
(Continued)

state variables of the resonator, in particular dominant mechanical state variables.

8 Claims, 1 Drawing Sheet

(58) Field of Classification Search
USPC .......... 331/158, 154, 175, 18; 73/781, 760
See application file for complete search history.

(56) References Cited

U.S. PATENT DOCUMENTS

| | | | |
|---|---|---|---|
| 5,869,763 | A | 2/1999 | Vig et al. |
| 6,420,938 | B1 | 7/2002 | Hoff et al. |
| 7,990,229 | B2 * | 8/2011 | Gaidarzhy ......... H03H 9/02409 331/175 |
| 2009/0038859 | A1 | 2/2009 | Itoh et al. |

OTHER PUBLICATIONS

Search Report issued in International Patent Application No. PCT/NL2014/050848, dated Feb. 10, 2015.

* cited by examiner

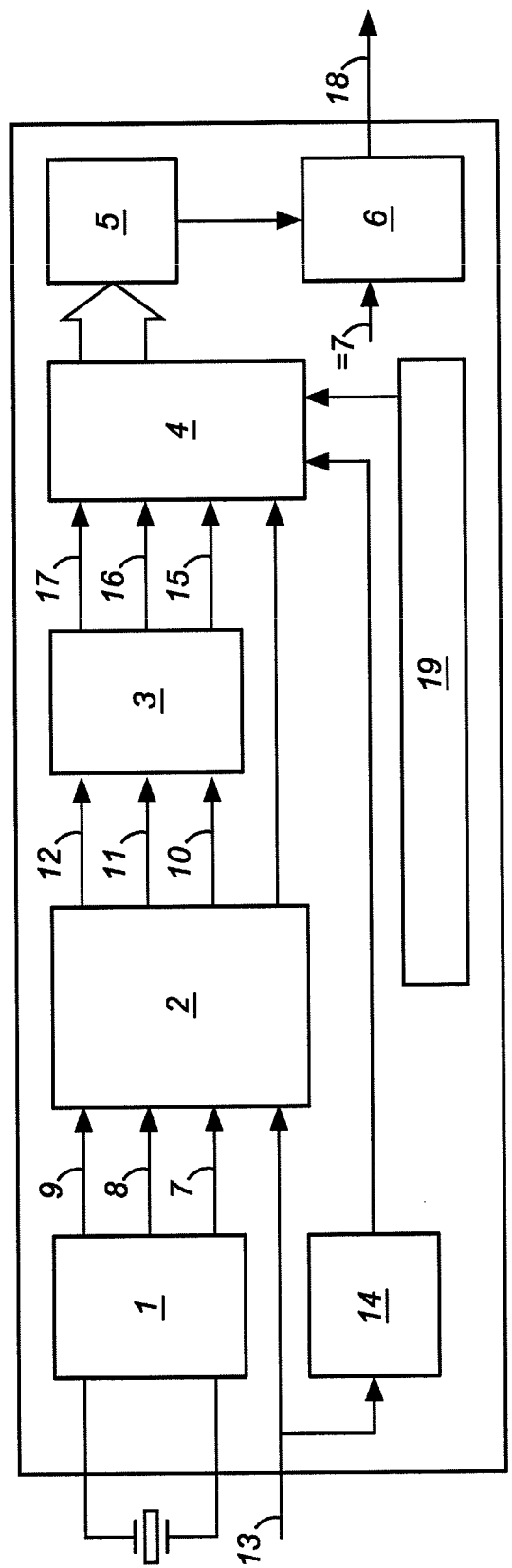

SYSTEM AND METHOD FOR OPERATING A MECHANICAL RESONATOR IN AN ELECTRONIC OSCILLATOR

The present invention relates to a system and method for operating a mechanical resonator in an electronic oscillator.

Mechanical resonators, such as crystal oscillators, are used as frequency and timing references in electronic equipment. Their frequency stability is of outmost importance. The specification of the frequency stability is usually partitioned over three time ranges, very short term, short term and long term.

Stability over a very short term, usually expressed by time jitter or phase noise, is limited by thermal noise associated with the losses in the crystal and noise added by the electronic oscillation circuit.

The very short term stability of crystal oscillators is known to be extremely good.

Crystal resonators have very low losses, that is expressed by their high quality factor (up to $10^6$). The noise contribution of the electronics can be kept low through careful design.

Stability over a short time interval is limited by frequency drift due to temperature changes.

A high short term stability of crystal oscillators usually requires special attention. For modern telecommunication purposes the intrinsic short term stability of crystal resonators needs to be improved. Since temperature is the direct cause for short term instability, current methods for improving the short term stability focuses on improvement of their temperature stability.

According to the state of the art, there the following approaches are known.

A first approach is isolation of temperature changes from the crystal, and optimization of the thermal operating point of the crystal. This is the approach taken in so-called ovenized crystal oscillators (OCXOs). Special SC-cut crystals that show zero temperature drift at about 80 degrees Celsius, are placed in an oven that operates at that temperature. The controlled oven isolates the crystal from temperature changes of the environment, up to the temperature at which it is controlled. A disadvantage of ovenized crystals is that they are relatively large, expensive and power consuming.

A second approach is to perform a temperature measurement, calibration and correction. This approach is taken in temperature compensated crystal oscillators (TCXOs) and in microprocessor-controlled crystal oscillators (MCXOs).

In TCXOs the temperature of the crystal is measured with a temperature sensor and the expected change of its frequency of oscillation is compensated by detuning the oscillator with an electrically controlled tuning device such as a VARICAP. The relation between the temperature and the tuning voltage for the VARICAP is determined and stored during calibration and reused during operation.

A disadvantage is that the improvement of the temperature stability is limited because the temperature of the sensor does not perfectly track that of the crystal under all circumstances. Due to factory calibration, the crystal needs to be paired with the electronics.

A third approach, used in MCXOs, is to determine the temperature with the aid of a dual mode oscillator and corrected by cascading it with a microprocessor-controlled frequency synthesizer. In a carefully designed dual-mode oscillator, the so-called beat frequency, which is the frequency difference between a normalized overtone resonance frequency and the fundamental resonance frequency of the crystal, strongly depends on temperature. During calibration this relation is stored and during operation it is used by a microprocessor-controlled frequency synthesizer to correct one of the output frequencies of the dual-mode oscillator. Temperature compensation in MCXOs performs much better than that in TCXOs because the information of the frequency change is derived from the crystal itself, rather than from a temperature sensor. However, the beat frequency, which is the difference between the fundamental frequency and a normalized overtone frequency and which is used as a measure for temperature in dual-mode oscillators, does not solely depend on temperature; it also depends on mechanical stress in the crystal resonator. Apart from a static component, mechanical stress may vary over time due to different thermal expansion coefficients of the crystal, its connection plates and mounting materials (creepage effects). This causes so-called retrace errors and requires high-performance MCXOs to be equipped with stress-compensated or SC-cut crystals. These crystals are more expensive than popular AT-cut crystals, that in turn are more sensitive to stress. Due to factory calibration, the SC-cut crystal needs to be paired with the electronics.

Stability over a very long period of time is limited by aging. A high-frequency stability over a very long time can be achieved using high-performance packaging techniques that prevent from chemical and physical changes in the operating environment of the crystal.

It is therefore a goal of the present invention, to take away the disadvantages of the prior art, or at least to provide a useful alternative.

The invention therefore comprises a system and method for operating a mechanical resonator in an electronic oscillator, making use of the fact that the resonance modes of mechanical resonators such as piezo crystal resonators, ceramic resonators and MEMS resonators depend on the mass, the stiffness, the dimensions and the mechanical shape of the materials in the resonator.

Most of those are accurately fixed by fabrication, but some of them may depend on the operating conditions of the resonator. For example, in crystal resonators, the dimensions of the crystal depend on temperature and, because to which the crystal is subjected, its stiffness may depend on temperature and life time.

According to the invention, an improved correction of the changes in the output frequency of a crystal oscillator is based upon a so called state space description of the resonator, in which the state variables are the mass, the stiffness and the dimensions of all the components used in the crystal resonator.

Direct measurement of the required these variables, is not required according to the invention. If the temperature drift and the retrace are predominantly affected by the dimensions and the stiffness of the crystal, then direct or indirect measurement of these two state variables already provides an solid base for frequency correction, including retrace.

The invention thus proposes a method initialising a mechanical resonator in an electronic oscillator, comprising:
a. Determining at least two independent electrically measurable parameters that represent state variables stiffness, mass and/or a dimension of a crystal resonator;
b. Measuring a resonance mode frequency of a crystal with respect to a known reference signal frequency;
c. Determining a frequency correction factor that is a ratio of the resonance mode frequency and the reference signal frequency;
d. Directly or indirectly changing the state variables;

e. Logging measurement values of the at least two parameters and the corresponding frequency correction factor in a table;
f. Repeating steps b to e a number of times to populate the table.

During the initialisation phase, a table with frequency correction factors can thus be obtained or be populated by performing measurements before taking the mechanical resonator actually in use. Once in use, the table may be used as a reference in order to provide a desired output frequency.

Indirect determination of the state variables may mean that the mechanical variables are determined by means of measurement of the electrical resonance parameters, such as the electrical losses, the equivalent inductance and the equivalent capacitance of the resonator. In addition, if a change in the value of the state variables manifests itself differently for different resonance modes of the crystal, such indirect determination may as well be achieved by measuring the output frequencies of a multi-mode crystal oscillator.

In fact: over an operation region for which these resonance frequencies form an independent set of variables that maps onto the set of dominant state variables, the correction can be found from a modified state space description of the crystal, in which the mechanical state variables are replaced by the resonant frequencies.

The at least two independent electrically measurable parameters may for instance be selected from the group of: a ratio of a resonance frequency of the crystal with respect to another resonance frequency of the crystal; a power loss in the crystal resonator at one or more of its resonance frequencies; a quality factor of the crystal resonator at one or more resonance frequencies.

In a further embodiment, the method according to the present invention comprises determining the frequency of a base frequency of the resonator in use, and determining at least the ratio between the base frequency and one of the overtones.

Therefore, the frequency or base frequency are determined indirectly, from another electric quantity, like electrical resonance parameters, such as the electrical losses, the equivalent inductance and the equivalent capacitance of the resonator.

The invention further relates to a method for operating a mechanical resonator in an electronic oscillator, configured as described above, and comprising the steps of measuring the at least two independent electrically measurable parameters; looking up the correction factor corresponding to the combination of measured parameters and multiplying the output frequency of the resonator with the correction factor.

The indirect measurement technique is applied in the current invention. It uses a triple-mode oscillator that produces three output frequencies that are accurately linked to three different resonance frequencies of the crystal. With one of the output frequencies assigned as reference, two frequencies ratios can be measured. These two ratios form set of modified state variables ($\phi_1$, $\phi_2$) of the crystal resonator.

The multiplication factor $\delta(t)$ for correction of the output frequency can be obtained from these two ratios as:

$$\delta(t) = \begin{bmatrix} \alpha_{10} & \alpha_{11} & \cdots & \alpha_{1n} \\ \alpha_{20} & \alpha_{21} & \cdots & \alpha_{2n} \end{bmatrix} \begin{bmatrix} 1 & 1 \\ \phi_1 & \phi_2 \\ \vdots & \vdots \\ \phi_1^n & \phi_2^n \end{bmatrix}$$

In which n represents the order of nonlinearity in the relation between the correction factor and the change of the state variables.

Current dual-mode oscillators that use the beat frequency as a measure for the temperature correction, use the simplified relation:

$$\delta(t) = \begin{bmatrix} \alpha_{10} & \alpha_{11} & \cdots & \alpha_{1n} \end{bmatrix} \begin{bmatrix} 1 \\ \phi_1 \\ \vdots \\ \phi_1^n \end{bmatrix}$$

In the current invention, two variables are required instead of only one, which makes it possible to compensate for retrace, which is not possible in dual mode oscillators.

The invention further relates to an electronic oscillator that uses a mechanical resonator, in which the output frequency of the oscillator is corrected by cascading it with a digitally controlled frequency synthesizer and in which the frequency correction data is obtained from determination of the state variables of the resonator, in particular the dominant mechanical state variables.

The invention will now be elucidated into more detail with reference to the following figure, wherein FIG. 1 shows a schematic overview of an electric circuit according to the invention.

FIG. 1 shows a simplified functional representation of an electric circuit according to the invention. The circuit comprises a triple-mode crystal oscillator circuit 1, a frequency measurement system 2, a frequency validator 3, a 3D array 4, a data interpolator 5, a fractional synthesizer 6 and a controller 19.

In use, the triple-mode crystal oscillator circuit generates three frequencies 7, 8, 9, that equal three resonance frequencies of the crystal; one of which is selected as base frequency for the fractional synthesizer that generates the output frequency 18.

A high-quality frequency reference signal 13 can be applied to the input of the electronic oscillator. In a self-learning or calibration mode, the frequency measurement system then determines the three different ratios of frequencies 10, 11, 12 generated by the triple-mode crystal oscillator as well as the frequency correction factor, which is the ratio of the selected base frequency and the reference frequency $f_1 f_{ref}$.

The frequency correction factor is the factor with which $f_{ref}$ 13 can be obtained from $f_1$ 7. It is stored (appended to existing data) together with a time stamp and a weighting coefficient, determined by the validator 14, at a memory location (x,y) in which x and y uniquely correspond to two ratios of frequencies generated by the triple-mode oscillator, say $f_1/f_2$ 7/8 and $f_1/f_3$ 7/9.

The memory addresses x and y thus represent the values of the two modified state variables that correspond to the specific operating conditions of the crystal and that change over time with the applied operating conditions.

With slow and rapid changing operating conditions of the crystal (e.g. with changing temperature), frequency correction data with time stamps and weighting coefficients are continuously stored at many different memory locations that map onto the many different operating states of the crystal.

The interpolator 5 estimates the frequency correction data from the date stored in the memory. The fractional synthesizer 6 generates its output frequency from the base frequency and the estimated correction data. The input data for the interpolator is updated with every read cycle. In this way, the output frequency 18 is continuously accurately related to the original frequency reference 13, whether present or not. One method for estimation of the frequency correction factor could be to calculate a weighted time average of the data stored at a set of memory locations close to those set by the address vector (x,y) and to perform a two-dimensional interpolation of the resulting data set.

The invention claimed is:

1. A method for initialising a mechanical resonator in an electronic oscillator, the method comprising:
    determining at least two independent electrically measurable parameters that represent state variables including stiffness, mass and/or a dimension of a crystal resonator;
    measuring a resonance mode frequency of a crystal with respect to a known reference signal frequency;
    determining a frequency correction factor that is a ratio of the resonance mode frequency and the reference signal frequency;
    changing, directly or indirectly, the state variables;
    logging measurement values of the at least two parameters and the corresponding frequency correction factor in a table;
    repeating the measuring of the resonance mode frequency, the determining of the frequency correction factor, the changing of the state variables, and the logging of the measurement values a number of times to populate the table,
    wherein the at least two independent electrically measurable parameters are selected from a group of:
    a ratio of a resonance frequency of the crystal and another resonance frequency of the crystal;
    power loss in the crystal resonator at one or more of its resonance frequencies; and
    a quality factor of the crystal resonator at one or more resonance frequencies.

2. The method according to claim 1, further comprising: determining a state space description, wherein the determining of the state space description comprises:
    determining values of a plurality of resonance frequencies of the resonator in use;
    determining a ratio of overtones; and
    providing a table of overtone ratios and corresponding frequency correction factors.

3. A method for operating a mechanical resonator in an electronic oscillator, configured according to claim 1, the method comprising:
    measuring the at least two independent electrically measurable parameters;
    looking up the frequency correction factor corresponding to the combination of measured parameters; and
    multiplying output frequency of the resonator with the frequency correction factor.

4. An electronic oscillator comprising a mechanical resonator, wherein an output frequency of the electronic oscillator is multiplied by a frequency correction factor, the frequency correction factor being obtained by the method according to claim 1.

5. The electronic oscillator according to claim 4, wherein the frequency correction factor is generated by a digitally controlled frequency synthesizer, in particular a fractional synthesizer.

6. The electronic oscillator according to claim 4, further comprising an addressable memory configured to store pairs of ratios of frequencies generated by the oscillator, wherein the pairs of ratios of frequencies form modified state variables that correspond to the specific operating conditions of the crystal.

7. The electronic oscillator according to claim 4, further comprising an interpolator configured to estimate frequency correction data from date stored in the memory.

8. The electronic oscillator according to claim 7, wherein a fractional synthesizer is configured to generate its output frequency from a base frequency and the estimated frequency correction data, and to update input data for the interpolator with every read cycle.

* * * * *